(12) United States Patent
Li et al.

(10) Patent No.: US 12,550,715 B2
(45) Date of Patent: Feb. 10, 2026

(54) HETEROGENEOUS INTEGRATION OF DEVICE DIE HAVING BSPDN

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Mukta Ghate Farooq, Hopewell Junction, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 18/155,784

(22) Filed: Jan. 18, 2023

(65) Prior Publication Data

US 2024/0243062 A1    Jul. 18, 2024

(51) Int. Cl.
| | |
|---|---|
| *H01L 23/528* | (2006.01) |
| *H01L 21/768* | (2006.01) |
| *H01L 23/00* | (2006.01) |
| *H01L 23/48* | (2006.01) |
| *H01L 23/498* | (2006.01) |
| *H01L 23/522* | (2006.01) |

(52) U.S. Cl.
CPC .... *H01L 23/5286* (2013.01); *H01L 21/76898* (2013.01); *H01L 23/481* (2013.01); *H01L 23/49827* (2013.01); *H01L 23/5226* (2013.01); *H01L 23/5283* (2013.01); *H01L 24/16* (2013.01); *H01L 2224/16245* (2013.01)

(58) Field of Classification Search
None
See application file for complete search history.

(56) References Cited

U.S. PATENT DOCUMENTS

| | | | |
|---|---|---|---|
| 9,397,073 | B1 | 7/2016 | England |
| 10,170,457 | B2 | 1/2019 | Chen |
| 10,510,561 | B2 | 12/2019 | Tsai |
| 10,748,870 | B2 | 8/2020 | Yu |
| 11,158,580 | B2 | 10/2021 | Sio |

(Continued)

OTHER PUBLICATIONS

Hossen et al., "Power Delivery Network (PDN) Modeling for Backside-PDN Configurations With Buried Power Rails and μTSVs", IEEE Transactions on Electron Devices, vol. 67, No. 1, Jan. 2020, pp. 11-17.

(Continued)

*Primary Examiner* — Khaja Ahmad
(74) *Attorney, Agent, or Firm* — Yuanmin Cai

(57) ABSTRACT

Embodiments of present invention provide a semiconductor structure. The structure includes a device die including a device layer; a back-end-of-line (BEOL) structure on a frontside of the device layer and a frontside substrate attached to the BEOL structure; and a backside power distribution network (BSPDN) structure on a backside of the device layer and a backside substrate attached to the BSPDN structure; and a device package including a base element and a lid element, wherein the device die is attached to the base element of the device package through multiple C4 bumps at the frontside substrate and is attached to the lid element of the device package at the backside substrate. A method of forming the same is also provided.

14 Claims, 11 Drawing Sheets

(56) References Cited

U.S. PATENT DOCUMENTS

| | | | |
|---|---|---|---|
| 11,270,991 B1 | 3/2022 | Chava | |
| 11,315,831 B2 | 4/2022 | Farooq | |
| 2015/0371938 A1* | 12/2015 | Katkar | H01L 21/6835 |
| | | | 438/666 |
| 2017/0141092 A1* | 5/2017 | Kim | H01L 24/73 |
| 2018/0218973 A1 | 8/2018 | Nelson | |
| 2021/0118805 A1* | 4/2021 | Sio | H01L 24/19 |
| 2021/0327778 A1* | 10/2021 | Yu | H01L 21/561 |
| 2021/0407942 A1 | 12/2021 | Yu | |
| 2022/0262791 A1 | 8/2022 | Shi | |

OTHER PUBLICATIONS

Nibhanupudi et al., "A Holistic Evaluation of Buried Power Rails and Back-Side Power for Sub-5 nm Technology Nodes", IEEE Transactions on Electron Devices, vol. 69, No. 8, pp. 4453-4459, Aug. 2022, pp. 4453-4459.

Pending U.S. Appl. No. 17/900,398, filed Aug. 31, 2022, entitled: "Transistors With Dual Power and Signal Lines", 39 pages.

Pending U.S. Appl. No. 17/946,546, filed Sep. 16, 2022, entitled: "Stacked Fets With Contact Placeholder Structures", 59 pages.

* cited by examiner

HETEROGENEOUS INTEGRATION OF DEVICE DIE HAVING BSPDN

BACKGROUND

The present application relates to manufacturing of semiconductor integrated circuits. More particularly, it relates to a process of integrating device dies with different thicknesses and the structure formed thereby.

Current heterogeneous integration (HI) process used in the industry generally involves integrating high bandwidth memory (HBM) die with regular logic die, where the HBM die and the logic die generally have comparable height or thickness, and any difference between the two may be compensated by padding some amount of thermally conductive adhesive material on top of either one or both dies. However, the regular logic die used in a HI package usually does not have backside power distribution network (BSPDN), which has been rapidly introduced into some advanced device dies recently, where power distribution to the circuitry in the dies are carried out by the BSPDN. In an advanced device die with BSPDN, substrate of the die has been generally thinned down to the device level to have a thickness, for example, around only 3 to 5 µm, which is dramatically different from that of a regular logic die whose substrate thickness is generally around 20 µm. It may be hard to compensate a thickness difference like this big, during a device packaging process, by using adhesive padding only. Therefore, a new approach is needed in order to compensate this thickness difference during a heterogenous integration of device packaging process.

SUMMARY

Embodiments of present invention provide a semiconductor structure. The semiconductor structure includes a device die, the device die including a device layer; a back-end-of-line (BEOL) structure on a frontside of the device layer and a frontside substrate attached to the BEOL structure; a backside power distribution network (BSPDN) structure on a backside of the device layer; and a backside substrate attached to the BSPDN structure; and a device package, the device package including a base element and a lid element, where the device die is attached to the base element of the device package through multiple C4 bumps at the frontside substrate and is attached to the lid element of the device package at the backside substrate. The backside substrate at the BSPDN structure and the frontside substrate at the BEOL structure help bring an overall thickness of the device die close to those of the logic and memory dies that surround the device die, thereby aiding a heterogenous integration process.

In one embodiment, the semiconductor structure further includes a logic die that includes a first substrate, and a logic circuitry and an interconnect structure on top of the first substrate, the logic die is attached to the base element of the device package through one or more C4 bumps at the interconnect structure; and has a thickness that is substantially same as a thickness of the device die. According to one embodiment, the thickness of the logic die is at least 15 µm thicker than a combined thickness of the BEOL structure, the device layer, and the BSPDN structure of the device die; and the thickness of the logic die is less than 1 µm different from the thickness of the device die. The use of the backside substrate and the frontside substrate helps compensate a thickness gap as big as 15 µm between the device die and the logic die.

In another embodiment, the semiconductor structure further includes a high bandwidth memory (HBM) die that includes a second substrate, and a plurality of memory cells and an interconnect structure on top of the second substrate, the HBM die is attached to the base element of the device package through one or more C4 bumps at the interconnect structure; and has a thickness that is substantially same as a thickness of the device die. According to one embodiment, the thickness of the HBM die is at least 15 µm thicker than a combined thickness of the BEOL structure, the device layer, and the BSPDN structure of the device die; and the thickness of the HBM die is less than 1 µm different from the thickness of the device die. Similarly, the use of the backside substrate and the frontside substrate helps compensate a thickness gap as big as 15 µm between the device die and the HBM die.

In one embodiment, the BEOL structure of the device die is connected to the BSPDN structure of the device die through at least one via. In another embodiment, the BEOL structure of the device die is connected to the base element of the device package through multiple through-silicon-vias (TSVs) made in the frontside substrate of the device die and through the multiple C4 bumps. In yet another embodiment, the frontside substrate and the backside substrate of the device die are bonded to the BEOL structure and the BSPDN structure through oxide bonding respectively.

Embodiments of present invention provide a semiconductor structure that includes a device die including a device layer; a back-end-of-line (BEOL) structure on a frontside of the device layer and a frontside substrate attached to the BEOL structure; a backside power distribution network (BSPDN) structure on a backside of the device layer; and a backside substrate attached to the BSPDN structure; and a logic die including a first substrate, a logic circuitry on top of the first substrate, and a first interconnect on top of the logic circuitry, where the logic die has a thickness that is substantially same as a thickness of the device die. The backside substrate at the BSPDN structure and the frontside substrate at the BEOL structure help bring an overall thickness of the device die close to that of the logic die, thereby aiding a heterogenous integration process of the device die with the logic die.

In one embodiment, the semiconductor structure further includes a high bandwidth memory (HBM) die including a second substrate, a plurality of memory cells on top of the second substrate, and a second interconnect structure on top of the plurality of memory cells, where the HBM die has a thickness that is substantially same as the thickness of the device die.

In another embodiment, the semiconductor structure further includes a device package including a base element and a lid element, where the frontside substrate of the device die, the first interconnect of the logic die, and the second interconnect structure of the HBM die are connected to the base element of the device package through one or more C4 bumps respectively.

In one embodiment, the thickness of the logic die and the thickness of the HBM die are at least 15 µm thicker than a combined thickness of the BEOL structure, the device layer, and the BSPDN structure of the device die. In another embodiment, the device die, the logic die, and the HBM die have a thickness difference that is zero or less than 1 µm. In yet another embodiment, the frontside substrate and the backside substrate of the device die are bonded to the BEOL structure and the BSPDN structure through oxide bonding respectively.

Embodiments of present invention further provide a method of forming a semiconductor structure. The method includes producing a device die and attaching the device die to a device package through multiple C4 bumps. Furthermore, producing the device die includes forming a device layer on a first carrier wafer; forming a back-end-of-line (BEOL) structure on a frontside of the device layer; attaching a second carrier wafer to the BEOL structure; removing the first carrier wafer from the device layer to expose a backside of the device layer; forming a backside power distribution network (BSPDN) structure on the backside of the device layer; attaching a backside substrate to the BSPDN structure and reducing the thickness of the backside substrate to a pre-determined thickness; and removing a portion of the second carrier wafer to form a frontside substrate on the BEOL structure.

According to one embodiment, the method further includes attaching a logic die to the device package, where reducing the thickness of the backside substrate includes causing a thickness of the device die to be substantially same as a thickness of the logic die, thereby aiding a heterogenous integration process of the device die and the logic die.

In one embodiment, the thickness of the logic die is at least 15 μm thicker than a combined thickness of the BEOL structure, the device layer, and the BSPDN structure of the device die, and the thickness of the logic die is less than 1 μm different from the thickness of the device die.

In another embodiment, attaching the second carrier wafer to the BEOL structure includes using oxide bonding to attach the second carrier wafer to a top surface of the BEOL structure. The oxide bonding process helps attaching the second carrier wafer to the BEOL structure.

In yet another embodiment, the first carrier wafer and the second carrier wafer have embedded etch-stop-layers. The etch-stop-layers help the process control in the removing or partial removing of the carrier wafers.

According to one embodiment, the method further includes forming at least one via, in the device die, connecting the BEOL structure with the BSPDN structure; and forming multiple through-silicon-vias (TSVs) in the frontside substrate of the device die.

BRIEF DESCRIPTION OF THE DRAWINGS

The present invention will be understood and appreciated more fully from the following detailed description of embodiments of present invention, taken in conjunction with accompanying drawings of which.

Figure 1:
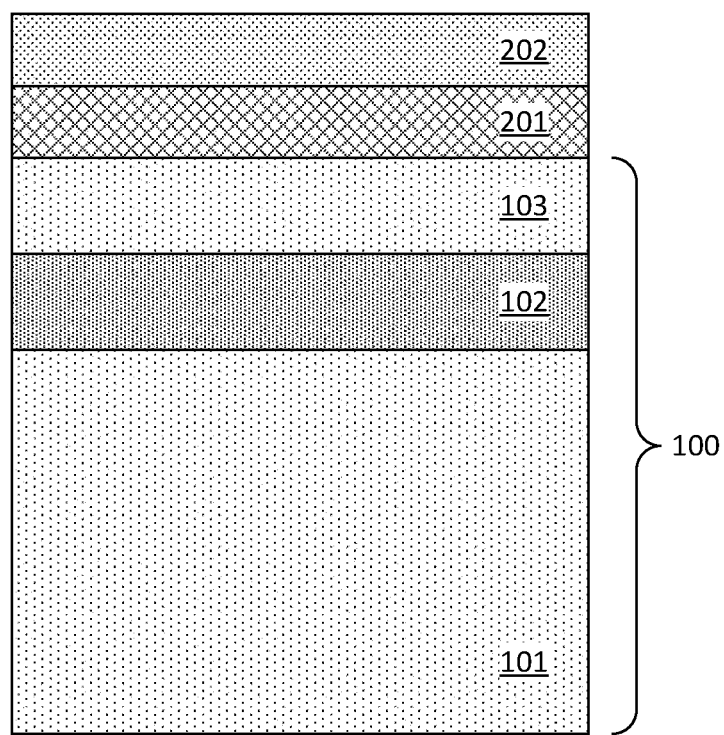
FIGS. 1-10 are demonstrative illustrations of cross-sectional views of a semiconductor structure in a process of manufacturing thereof according to various embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a semiconductor structure in a process of manufacturing thereof according to embodiments of present invention. More particularly, embodiments of present invention provide forming a semiconductor structure by providing or receiving a first carrier wafer 100 and subsequently forming a device layer 201 on top of the first carrier wafer 100. The first carrier wafer 100 may be a semiconductor wafer and include an etch-stop-layer (ESL) 102 embedded therein. For example, the first carrier wafer 100 may be a silicon-on-insulator (SOI) substrate including a bulk substrate 101 such as a bulk silicon substrate, the ESL 102 such as an oxide layer, and a semiconductor layer 103 such as a silicon layer. However, embodiments of present invention are not limited in this aspect and other types of first carrier wafer 100 may be used as well. For example, the ESL 102 may be a silicon-germanium (SiGe) layer epitaxially formed on top of the bulk substrate 101 of bulk silicon (Si), and the semiconductor layer 103 may be a silicon layer formed epitaxially on top of the SiGe layer.

The device layer 201 may include a front-end-of-line (FEOL) structure, which may include various transistor structures such as, for example, planar transistors, fin-type transistors and/or nanosheet transistors, and may include a middle-of-line (MOL) structure, which may include connections to source/drain and gate of the various transistors. Embodiments of present invention further provide forming a back-end-of-line (BEOL) structure 202 on top of the device layer 201. For example, the BEOL structure 202 may be formed on a frontside of the device layer 201 while a backside of the device layer 201 is formed on top of the first carrier wafer 100 at the semiconductor layer 103. The BEOL structure 202 provides interconnect functionalities for the device layer 201.

Figure 2:
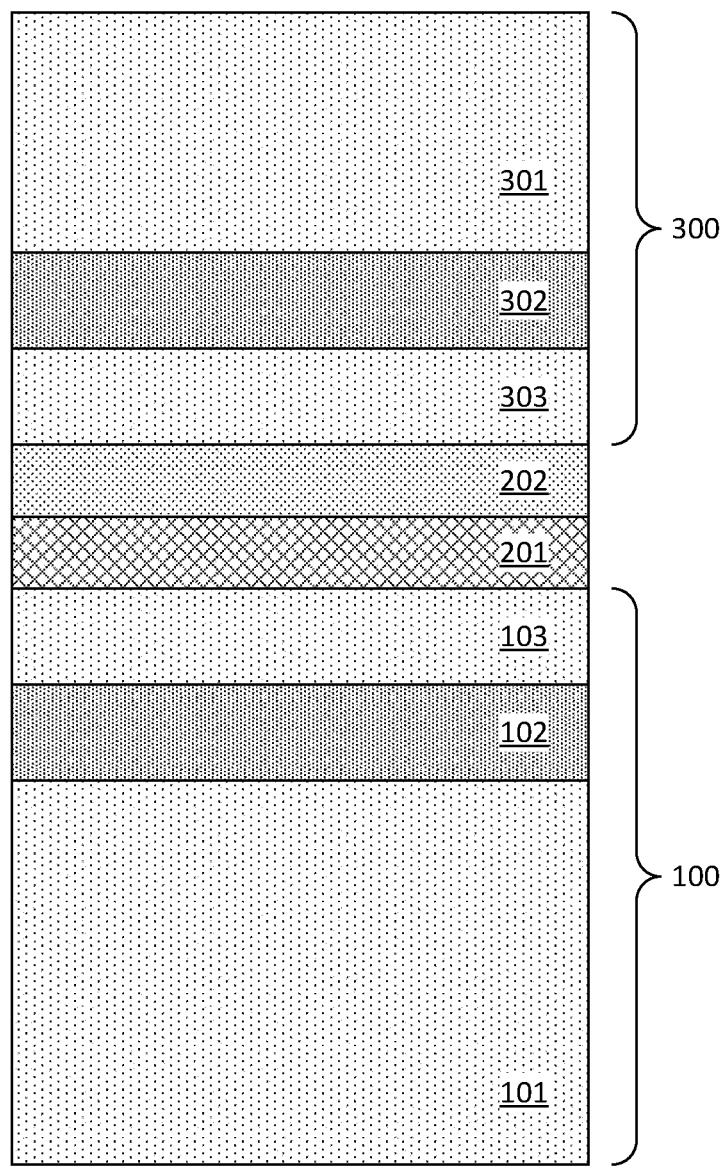

FIG. 2 is a demonstrative illustration of cross-sectional view of a semiconductor structure in a process of manufacturing thereof according to embodiments of present invention. More particularly, embodiments of present invention provide attaching a second carrier wafer 300 to the BEOL structure 202. The second carrier wafer 300 may be a carrier wafer having an ESL embedded therein to include a bulk substrate 301, an ESL 302 on top of the bulk substrate 301, and a semiconductor layer 303 on top of the ESL 302. The second carrier wafer 300 may be attached to the BEOL structure 202 through an oxide bonding process using oxide as a bonding agent between the BEOL structure 202 and the second carrier wafer 300.

Figure 3:
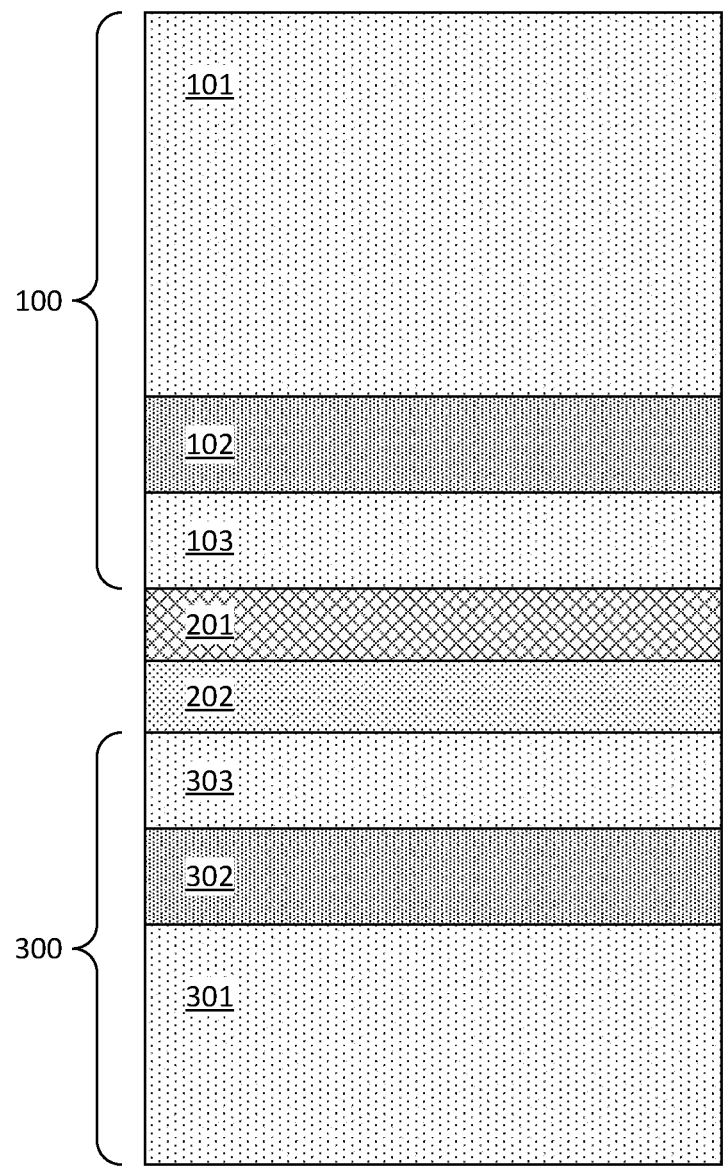

FIG. 3 is a demonstrative illustration of cross-sectional view of a semiconductor structure in a process of manufacturing thereof according to embodiments of present invention. More particularly, FIG. 3 is a demonstrative illustration of the semiconductor structure illustrated in FIG. 2 when after the semiconductor structure has been flipped upside-down. Embodiments of present invention provide continuing to process the semiconductor structure from a backside thereof, as being described below in more details.

Figure 4:
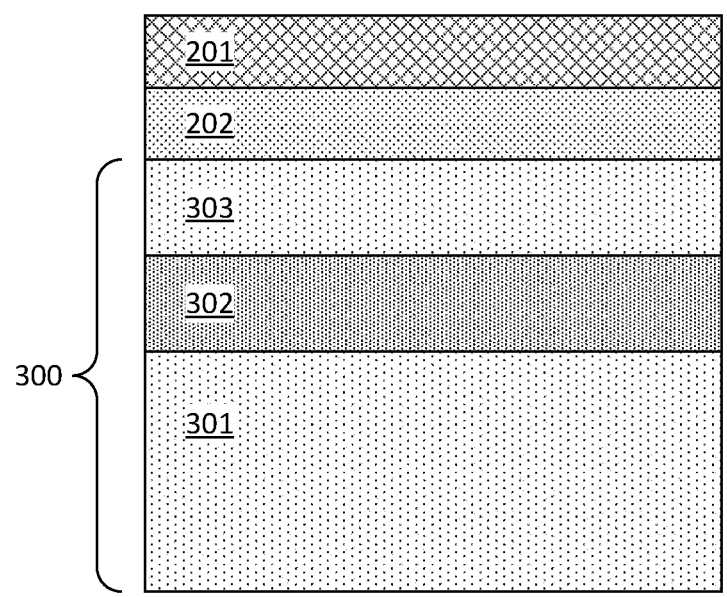

FIG. 4 is a demonstrative illustration of cross-sectional view of a semiconductor structure in a process of manufacturing thereof according to embodiments of present invention. More particularly, embodiments of present invention provide removing the first carrier wafer 100 from the device layer 201 thereby exposing the backside of the device layer 201. The removing of the first carrier wafer 100 may be made through, for example, a grinding process, a chemical-mechanic-polishing (CMP) process, and/or a selective etching process, and the ESL 102 may aid such removing process, for example, by enabling selectivity between ESL 102 and the bulk substrate 101 during the removing process. The ESL 102 and the semiconductor layer 103 may subsequently be removed, after the bulk substrate 101 is removed, through a CMP process or other selective etching processes.

Figure 5:
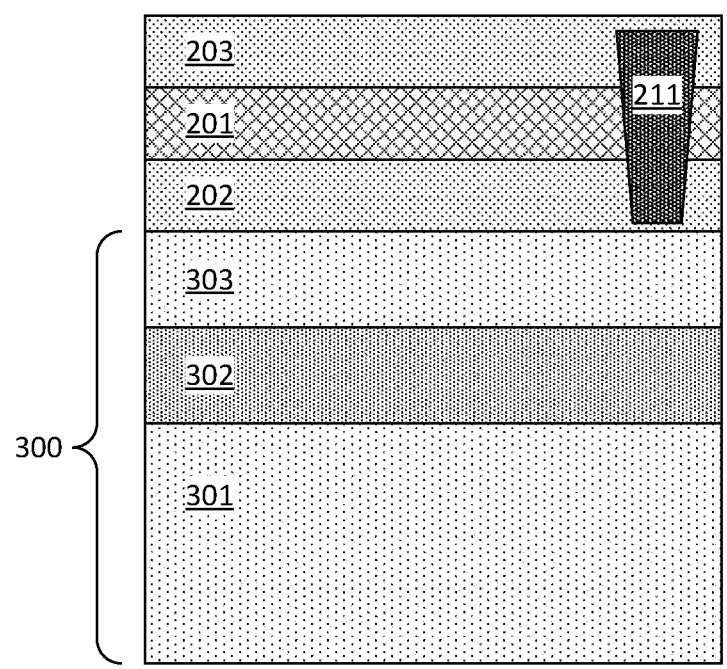

FIG. 5 is a demonstrative illustration of cross-sectional view of a semiconductor structure in a process of manufacturing thereof according to embodiments of present invention. More particularly, embodiments of present invention provide forming a backside power distribution network (BSPDN) structure 203 at the backside of the device layer 201 and forming at least one via such as a via 211 that provides electrical connection, through the device layer 201, between the BSPDN structure 203 and the BEOL structure 202. In addition to providing electrical connection to the BEOL structure 202, the BSPDN structure 203 provides power distribution to the active devices such as transistors in the device layer 201. However, embodiments of present invention may not be limited in this aspect and the BSPDN structure 203 may be used to provide interconnection of electric signals as well. In one embodiment, the BSPDN structure 203 may be various metal layers embedded in one or more dielectric layers or a dielectric environment.

Figure 6:
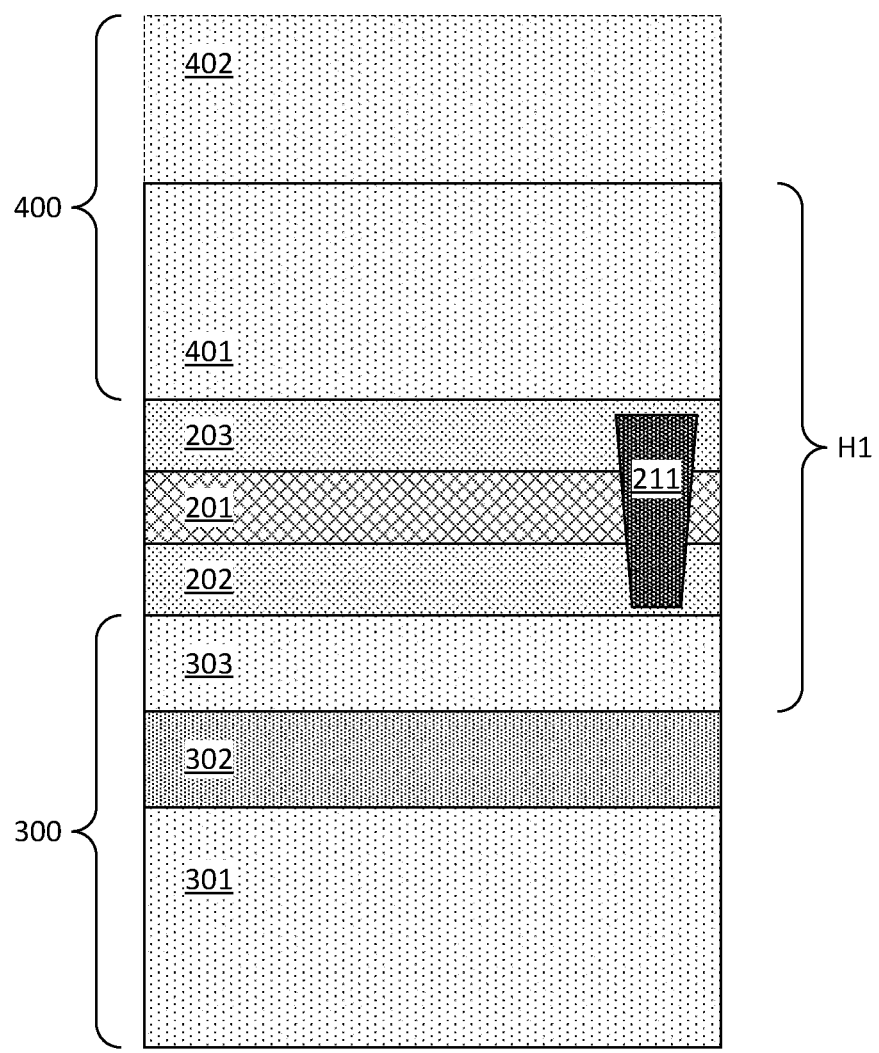

FIG. 6 is a demonstrative illustration of cross-sectional view of a semiconductor structure in a process of manufacturing thereof according to embodiments of present invention. More particularly, embodiments of present invention provide attaching a bulk substrate 400 to the BSPDN structure 203 through an oxide bonding process, and subsequently reducing a thickness of the bulk substrate 400 by removing a portion 402 of the bulk substrate 400 through, for example, a grinding process and/or a CMP process thereby producing a backside substrate 401 that is attached to the BSPDN structure 203. Embodiments of present invention provide reducing the thickness of the backside substrate 401 to a pre-determined thickness, for example, by causing a combined thickness H1 of the backside substrate 401, the BSPDN structure 203, the device layer 201, the BEOL structure 202, and a frontside substrate (to be formed later) to be substantially same as a thickness of a regular logic die that does not have or contain any BSPDN structure and/or a high bandwidth memory (HBM) die. As being described below in more details, the backside substrate 401, the BSPDN structure 203, the device layer 201, the BEOL structure 202, and the frontside substrate together may form a device die 600 (see FIG. 8) that is to be heterogenous integrated or co-packaged with the regular logic die and/or the HBM die in a device package.

Figure 7:
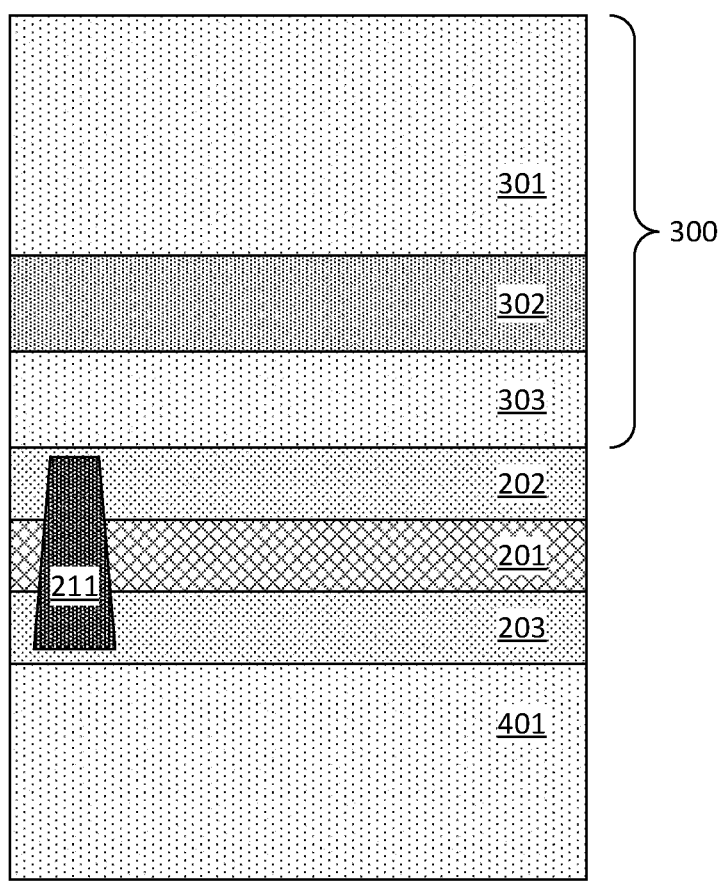

FIG. 7 is a demonstrative illustration of cross-sectional view of a semiconductor structure in a process of manufacturing thereof according to embodiments of present invention. More particularly, after the bulk substrate 400 has been thinned down to become the backside substrate 401, embodiments of present invention provide flipping the semiconductor structure upside-down again, downside-up this time, to continue processing at the frontside of the device layer 201, to which the second carrier wafer 300 is still attached.

Figure 8:
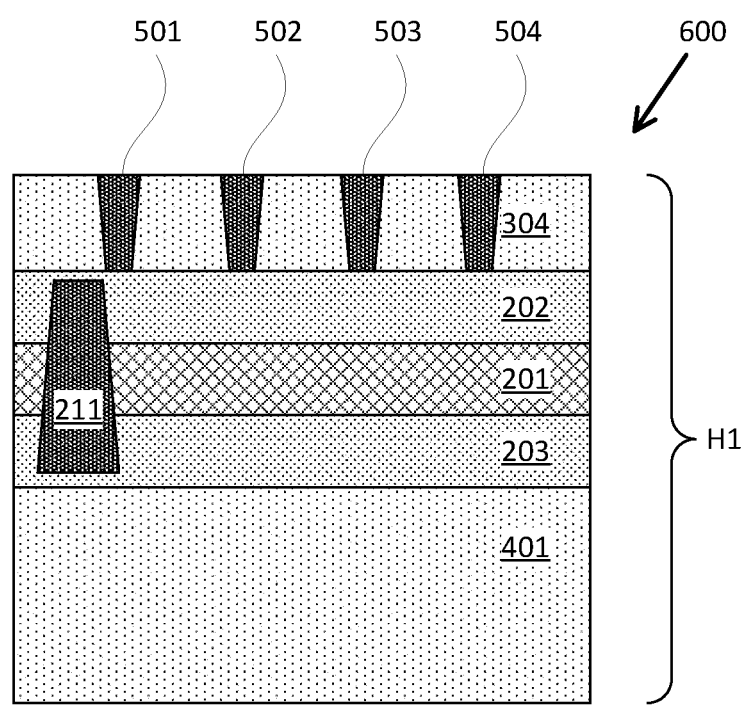

FIG. 8 is a demonstrative illustration of cross-sectional view of a semiconductor structure in a process of manufacturing thereof according to embodiments of present invention. More particularly, embodiments of present invention provide removing a portion of the second carrier wafer 300 to produce a frontside substrate 304 that is attached, or more particularly oxide bonded to the BEOL structure 202 at the frontside of the device layer 201. For example, embodiments of present invention may provide removing the bulk substrate 301 of the second carrier wafer 300 through a grinding process, a CMP process, and/or a selective etching process until the ESL 302 is exposed and subsequently removing the ESL 302 through a CMP process and/or a selective etching process to expose the underneath semiconductor layer 303. In one embodiment, the semiconductor layer 303 may be further processed to remove, optionally, a portion thereof to produce a desired thickness, which together with thicknesses of the backside substrate 401, the BSPDN structure 203, the device layer 201, and the BEOL structure 202 may produce a combined thickness H1 that is desirable or advantageous in a follow-up heterogenous integration process of the device die 600 with other logic dies and/or HBM dies.

Embodiments of present invention further provide forming one or more through-silicon-vias (TSVs) such as TSV 501, 502, 503, and 504 in the frontside substrate 304. The TSVs 501, 502, 503, and 504, when being connected to a base element of a device package with multiple controlledcollapse-chip-connection (C4) bumps, may provide electrical connection of the base element to the BEOL structure 202.

Figure 9:
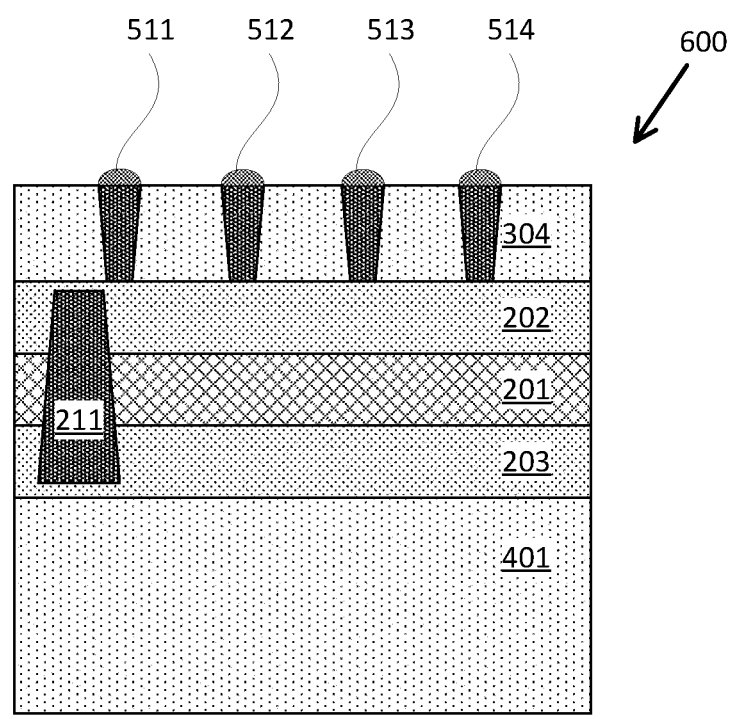

FIG. 9 is a demonstrative illustration of cross-sectional view of a semiconductor structure in a process of manufacturing thereof according to embodiments of present invention. More particularly, embodiments of present invention provide forming multiple C4 bumps such as C4 bumps 511, 512, 513, and 514 directly on top of the TSVs 501, 502, 503, and 504 respectively. The C4 bumps 511, 512, 513, and 514 may be used to solder the device die 600 onto a device package during a packaging process as being described below in more details.

Figure 10:
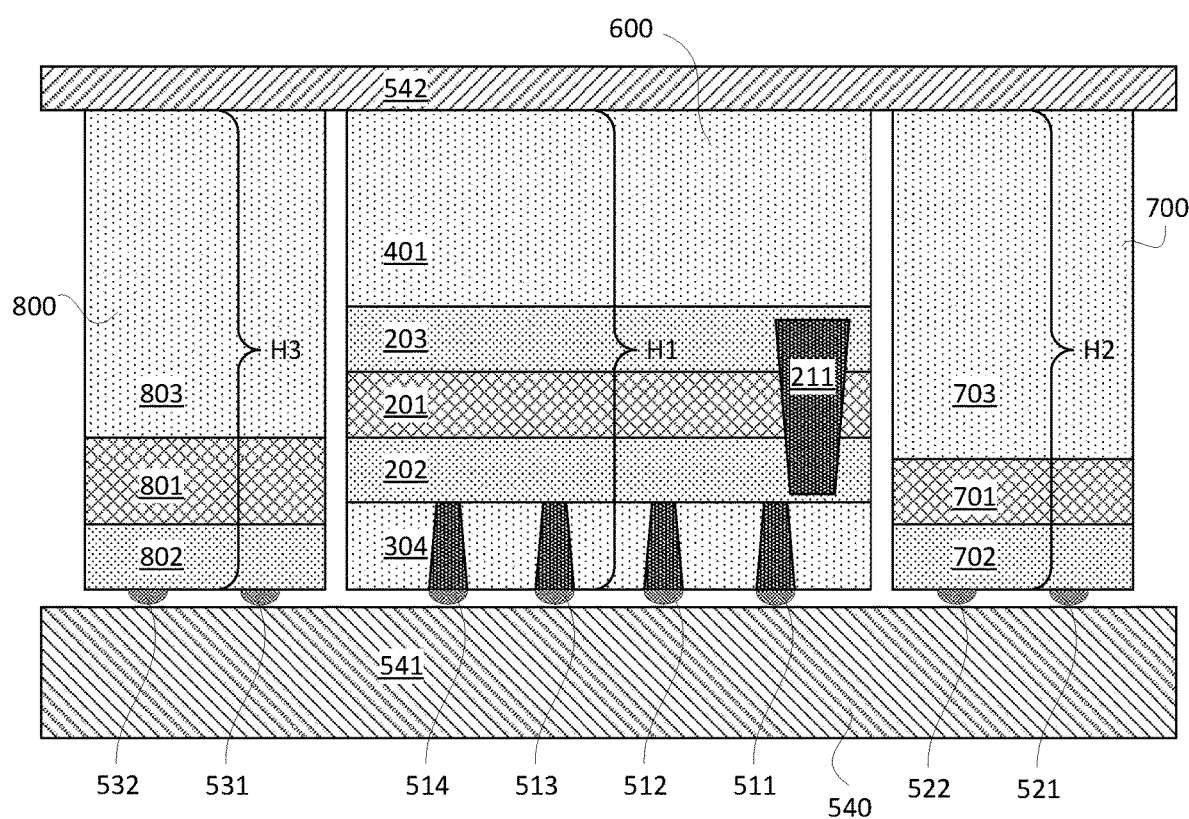

FIG. 10 is a demonstrative illustration of cross-sectional view of a semiconductor structure in a process of manufacturing thereof according to embodiments of present invention. More particularly, embodiments of present invention provide flipping the device die 600 upside-down again and soldering the device die 600 onto a base element 541 of a device package 540. The device package 540 may include the base element 541 and a lid element 542 and the lid element 542 may be attached to the backside substrate 401, optionally through a thin layer of thermal adhesive.

Embodiments of present invention further provide integrating or packaging a logic die 700 together with the device die 600 between the base element 541 and the lid element 542 of the device package 540. In one embodiment, the logic die 700 may include a first substrate 703, a logic circuitry 701 formed on top of the first substrate 703, and a first interconnect 702 formed on top of the logic circuitry 701. The logic die 700 may be connected or soldered to the base element 541 of the device package 540 through one or more C4 bumps such as C4 bumps 521 and 522. The logic die 700 may not include any BSPDN structure and may be referred to as a regular logic die.

In one embodiment, the logic die 700 may have a thickness H2 that is substantially same as the thickness H1 of the device die 600. In other words, a difference in thickness between the logic die 700 and the device die 600 may be zero or close to zero, and in one embodiment may be less than 1 μm. On the other hand, the thickness H2 of the logic die 700 may be at least 15 μm thicker than a combined thickness of the BSPDN structure 203, the device layer 201, and the BEOL structure 202 of the device die 600.

Embodiments of present invention may further provide integrating or packaging a HBM die 800 together with the device die 600, and possibly with the logic die 700 as well, between the base element 541 and the lid element 542 of the device package 540. In one embodiment, the HBM die 800 may include a second substrate 803, a plurality of memory cells 801 formed on top of the second substrate 803, and a second interconnect 802 formed on top of the plurality of memory cells 801. The HBM die 800 may be connected or soldered to the base element 541 of the device package 540 through one or more C4 bumps such as C4 bumps 531 and 532.

In one embodiment, the HBM die 800 may have a thickness H3 that is substantially same as the thickness H1 of the device die 600. In other words, a difference in thickness between the HBM die 800 and the device die 600 may be zero or close to zero, and in one embodiment may be less than 1 μm. On the other hand, the thickness H3 of the HBM die 800 may be at least 15 μm thicker than a combined thickness of the BSPDN structure 203, the device layer 201, and the BEOL structure 202 of the device die 600.

It is apparent from the above description that without the backside substrate 401 padding a difference in thickness between the device die 600 and the logic die 700 and/or the HBM die 800, it would be challenging, if not impossible, to integrate the logic die 700 and/or the HBM die 800 with the device die 600, among which there is a thickness difference or gap that is close to 15 μm large. Embodiments of present invention provide a structure and accompany approach that headed off such challenges.

Figure 11:
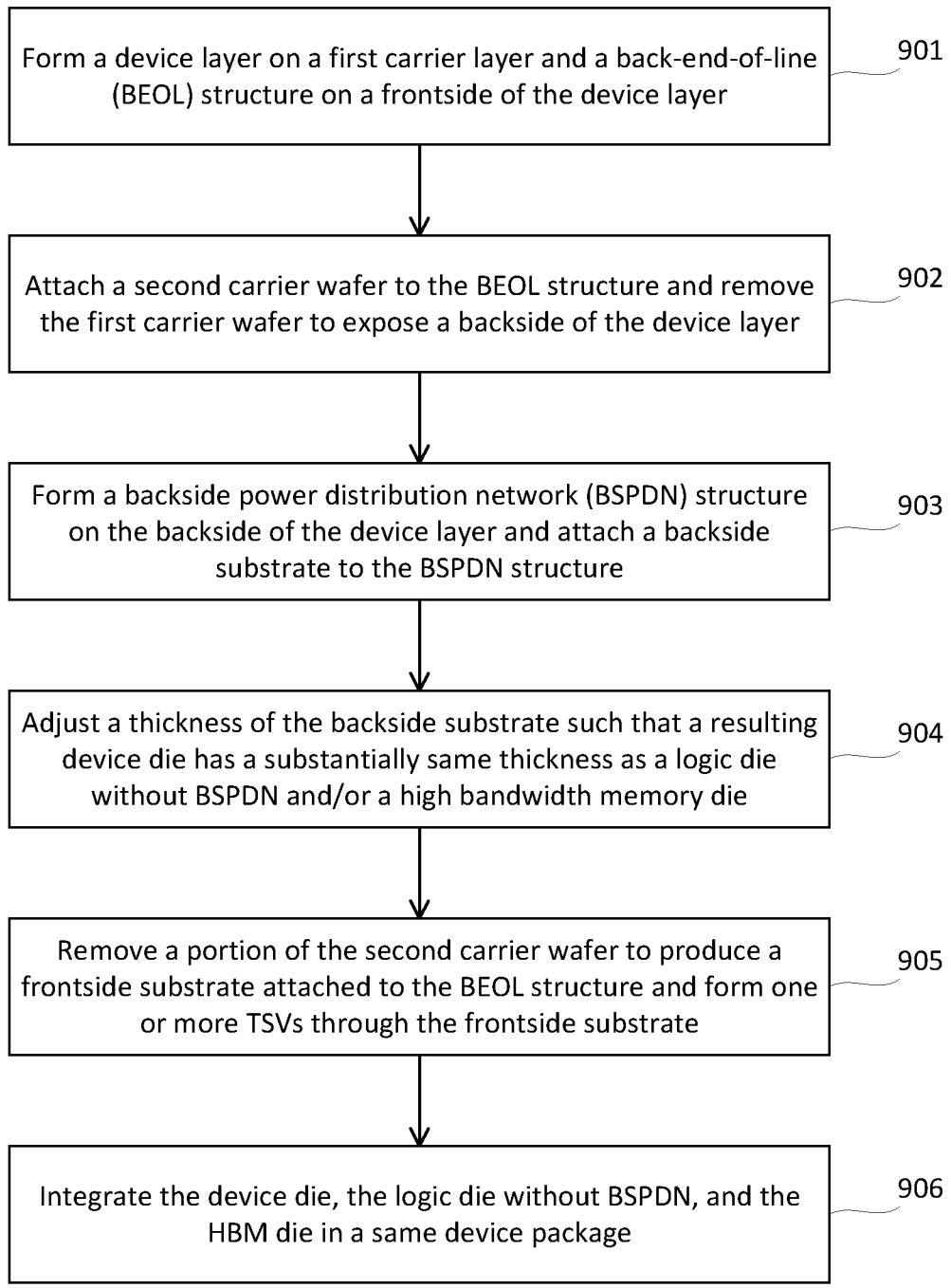
FIG. 11 is a demonstrative illustration of a flow-chart of a method of manufacturing a semiconductor structure according to embodiments of present invention.

FIG. 11 is a demonstrative illustration of a flow-chart of a method of manufacturing a semiconductor structure according to embodiments of present invention. The method includes (901) forming a device layer on a first carrier wafer and a back-end-of-line (BEOL) structure on a frontside of the device layer; (902) attaching a second carrier wafer to the BEOL structure and remove the first carrier wafer to expose a backside of the device layer; (903) forming a backside power distribution network (BSPDN) structure on the backside of the device layer and attaching a backside substrate to the BSPDN structure; (904) adjusting and/or reducing a thickness of the backside substrate such that a resulting device die formed later will have a substantially same thickness as that of a logic die that does not have BSPDN, and/or a substantially same thickness as that of a high bandwidth memory (HBM) die; (905) removing a portion of the second carrier wafer to produce a frontside substrate that is attached to the BEOL structure of the device die, and forming one or more through-silicon-vias (TSVs) through the frontside substrate; and (906) integrating or packaging the device die, the logic die without the BSPDN, and the HBM die together in a same device package.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
   a device die, the device die including a device layer; a back-end-of-line (BEOL) structure on a frontside of the device layer and a frontside substrate attached to the BEOL structure; a backside power distribution network (BSPDN) structure on a backside of the device layer; and a backside substrate attached to the BSPDN structure; and
   a device package, the device package including a base element and a lid element,
   wherein the device die is attached to the base element of the device package through multiple C4 bumps at the frontside substrate and is attached to the lid element of the device package at the backside substrate.

2. The semiconductor structure of claim 1, further comprising a logic die that includes a first substrate, and a logic circuitry and an interconnect structure directly on top of the first substrate, wherein the first substrate is different from the backside substrate; the logic die is attached to the base element of the device package through one or more C4 bumps at the interconnect structure and directly attached to the lid element at the first substrate; and the logic die has a thickness that is substantially same as a thickness of the device die.

3. The semiconductor structure of claim 2, wherein the thickness of the logic die is at least 15 μm thicker than a combined thickness of the BEOL structure, the device layer, and the BSPDN structure of the device die; and the thickness of the logic die is less than 1 μm different from the thickness of the device die.

4. The semiconductor structure of claim 1, further comprising a high bandwidth memory (HBM) die that includes a second substrate, and a plurality of memory cells and an interconnect structure directly on top of the second substrate, wherein the second substrate is different from the backside substrate; the HBM die is attached to the base element of the device package through one or more C4 bumps at the interconnect structure and directly attached to the lid element at the second substrate; and the HBM die has a thickness that is substantially same as a thickness of the device die.

5. The semiconductor structure of claim 4, wherein the thickness of the HBM die is at least 15 μm thicker than a combined thickness of the BEOL structure, the device layer, and the BSPDN structure of the device die; and the thickness of the HBM die is less than 1 μm different from the thickness of the device die.

6. The semiconductor structure of claim 1, wherein the BEOL structure of the device die is connected to the BSPDN structure of the device die through at least one via.

7. The semiconductor structure of claim 6, wherein the BEOL structure of the device die is electrically connected to the base element of the device package through multiple through-silicon-vias (TSVs) made in the frontside substrate of the device die and through the multiple C4 bumps.

8. The semiconductor structure of claim 1, wherein the frontside substrate and the backside substrate of the device die are bonded to the BEOL structure and the BSPDN structure through oxide bonding respectively.

9. A semiconductor structure comprising:
   a device die, the device die including a device layer; a back-end-of-line (BEOL) structure on a frontside of the device layer and a frontside substrate attached to the BEOL structure; a backside power distribution network (BSPDN) structure on a backside of the device layer; and a backside substrate attached to the BSPDN structure; and
   a logic die, the logic die including a first substrate, a logic circuitry on top of the first substrate, and a first interconnect on top of the logic circuitry,
   wherein the logic die has a thickness that is substantially same as a thickness of the device die.

10. The semiconductor structure of claim 9, further comprising a high bandwidth memory (HBM) die, the HBM die including a second substrate, a plurality of memory cells on top of the second substrate, and a second interconnect structure on top of the plurality of memory cells, wherein the HBM die has a thickness that is substantially same as the thickness of the device die.

11. The semiconductor structure of claim 10, further comprising a device package including a base element and a lid element, wherein the frontside substrate of the device die, the first interconnect of the logic die, and the second interconnect structure of the HBM die are connected to the base element of the device package through one or more C4 bumps respectively.

12. The semiconductor structure of claim 10, wherein the thickness of the logic die and the thickness of the HBM die are at least 15 μm thicker than a combined thickness of the BEOL structure, the device layer, and the BSPDN structure of the device die.

13. The semiconductor structure of claim 10, wherein the device die, the logic die, and the HBM die have a thickness difference that is zero or less than 1 μm.

14. The semiconductor structure of claim 9, wherein the frontside substrate and the backside substrate of the device die are bonded to the BEOL structure and the BSPDN structure through oxide bonding respectively.

* * * * *